(12) United States Patent
Ho

(10) Patent No.: US 8,786,502 B2
(45) Date of Patent: Jul. 22, 2014

(54) ELECTROMAGNETIC ANECHOIC CHAMBER

(75) Inventor: Ten-Chen Ho, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 201 days.

(21) Appl. No.: 13/535,628

(22) Filed: Jun. 28, 2012

(65) Prior Publication Data
US 2013/0335253 A1  Dec. 19, 2013

(30) Foreign Application Priority Data
Jun. 13, 2012  (CN) .................. 2012 1 01935591

(51) Int. Cl.
*H01Q 17/00* (2006.01)
*G01R 29/10* (2006.01)
*G01R 29/08* (2006.01)

(52) U.S. Cl.
CPC .............. *H01Q 17/00* (2013.01); *G01R 29/105* (2013.01); *G01R 29/0871* (2013.01)
USPC .......................................... 343/703; 343/877

(58) Field of Classification Search
CPC ... H01Q 17/00; G01R 29/105; G01R 29/0871
USPC .......................... 343/703, 877, 874, 890, 892
See application file for complete search history.

(56) References Cited

U.S. PATENT DOCUMENTS

| | | | |
|---|---|---|---|
| 7,911,400 B2* | 3/2011 | Kaplan et al. | 343/713 |
| 2009/0140750 A1* | 6/2009 | Sugiura et al. | 324/627 |
| 2010/0005670 A1* | 1/2010 | Tsai et al. | 33/228 |

* cited by examiner

*Primary Examiner* — Hoanganh Le
(74) *Attorney, Agent, or Firm* — Novak Druce Connolly Bove + Quigg LLP

(57) ABSTRACT

An electromagnetic anechoic chamber includes an anechoic chamber, an adjusting apparatus, and an antenna device. The anechoic chamber includes a bottom wall defining a rectangular receiving space, and a shielding plate supported on a bottom wall. The adjusting apparatus is received in the receiving space and includes a supporting bracket, two adjusting pulleys respectively installed to two opposite ends of the supporting bracket, and a transmission belt wrapping around the adjusting pulleys. The antenna device includes a base slidably supported on the supporting bracket and an adjusting pole perpendicularly extending up from the base. The adjusting pole extends through the transmission belt and the shielding plate. A motor drives one of the adjusting pulleys to rotate, the transmission belt is moved through the adjusting pulley to move the antenna device.

9 Claims, 5 Drawing Sheets

ELECTROMAGNETIC ANECHOIC CHAMBER

BACKGROUND

1. Technical Field

The present disclosure relates to quality testing of information technology equipment (ITE), and particularly to an electromagnetic anechoic chamber for testing the EMI of the ITE.

2. Description of Related Art

In electromagnetic measurement, such as electromagnetic interference (EMI) measurement, a test antenna may need to be fixed in an antenna holding device for measuring the EMI of various kinds of information technology equipment (ITEs), such as personal computers, liquid crystal displays, or mobile phones. However, the ITEs have different EMI measurement specifications, so the antenna holding device needs to be moved relative to the ITEs to allow the test distance to meet the corresponding measurement specification, which is time-consuming and inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
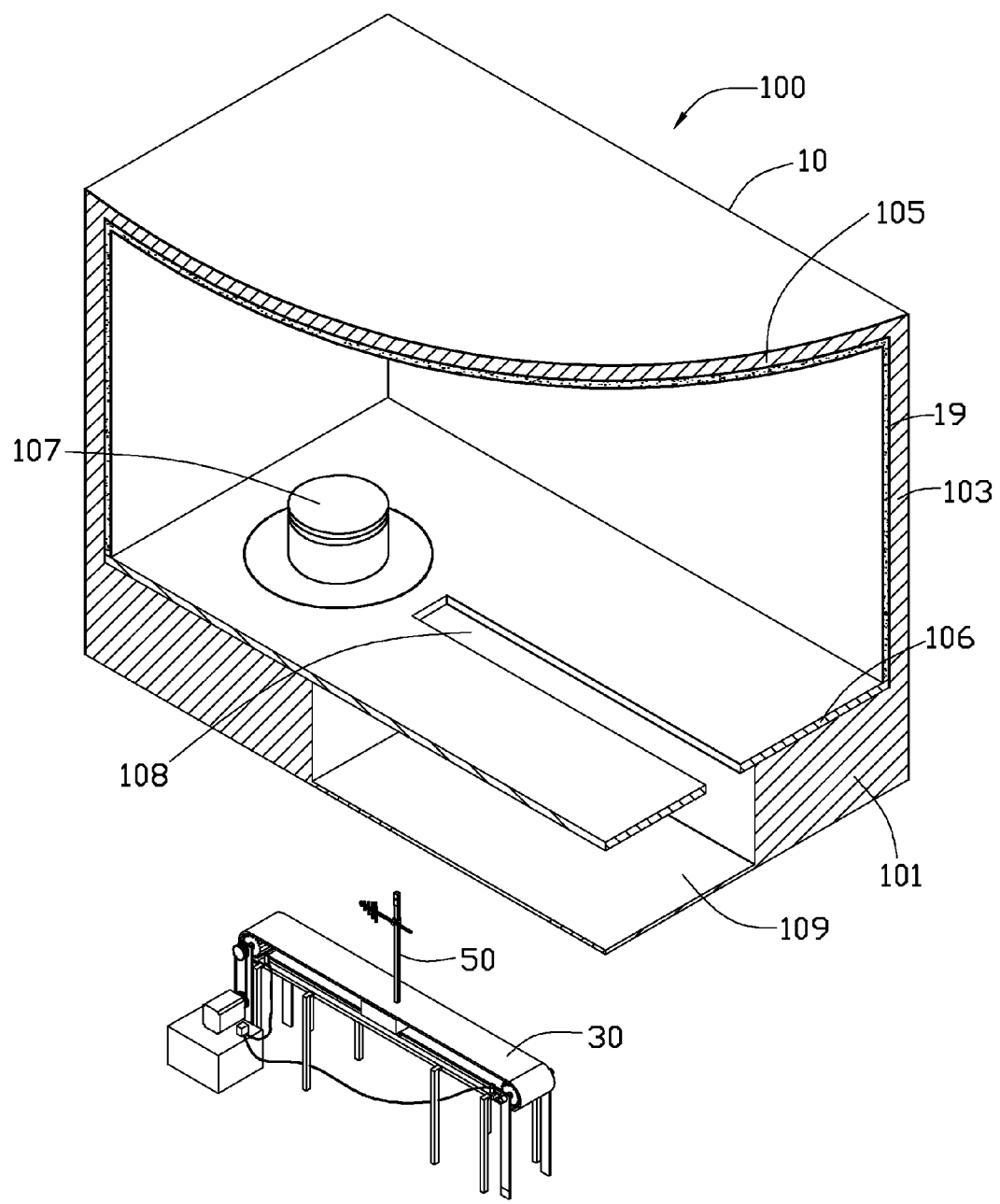
FIG. 1 is an exploded, partially cutaway, and isometric view of an exemplary embodiment of an electromagnetic anechoic chamber, wherein the electromagnetic anechoic chamber includes an adjusting apparatus and an antenna holding device.

FIG. 1 shows an exemplary embodiment of an electromagnetic anechoic chamber 100. The electromagnetic anechoic chamber 100 can be used to measure intensity of electromagnetic radiation generated by items of information technology equipment (ITE) 90 (shown in FIG. 5), such as personal computers, liquid crystal displays, and mobile telephones. The electromagnetic anechoic chamber 100 includes an anechoic chamber 10, an adjusting apparatus 30, and an antenna holding device 50.

The anechoic chamber 10 includes a bottom wall 101, a top wall 105 parallel to the bottom wall 101, a sidewall 103 perpendicularly connected between corresponding sides of the bottom wall 101 and top wall 105, a shielding plate 106 supported on the bottom wall 101, and a test bench 107 supported on the shielding plate 106 for support the ITE 90. Electromagnetic wave absorptive material 19 is spread on inner surfaces of the top wall 101 and the sidewall 103. The shielding plate 106 defines a longitudinal slot 108, extending along a direction parallel to the sidewall 103 and aligning with the center of the test bench 107. The bottom wall 101 defines a receiving space 109 communicating with the slot 108. The shielding plate 106 is made of electromagnetic interference (EMI) shielding material, such as copper, aluminum, or steel.

Figure 2:
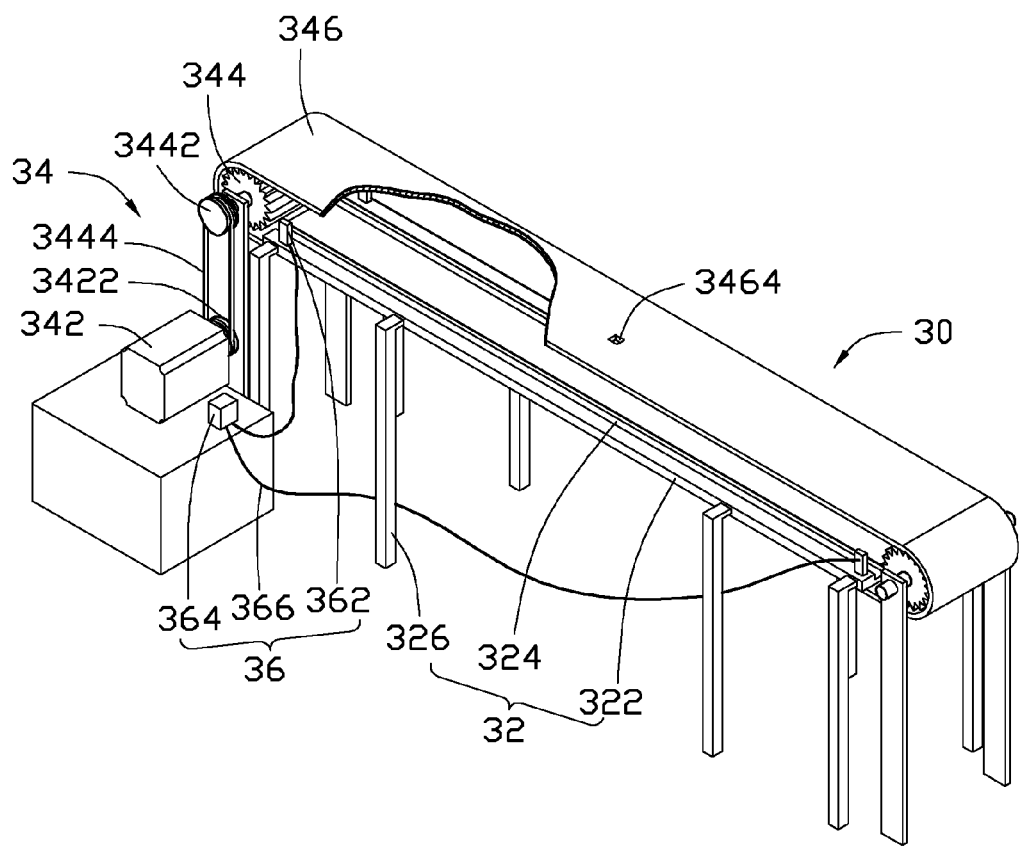
FIG. 2 is an enlarged, partially cutaway, and isometric view of the adjusting apparatus of FIG. 1.

Referring to FIG. 2, the adjusting apparatus 30 includes a support bracket 32, a drive apparatus 34, and a switch 36.

The support bracket 32 includes a rectangular support plate 322 and a plurality of support posts 326 respectively extending down from two opposite sides of the support plate 322. A top surface of the support plate 322 defines two parallel slide grooves 324 extending along a lengthwise direction of the support plate 322.

The drive apparatus 34 includes a motor 342, two adjusting pulleys 344 respectively installed to two opposite ends of the support bracket 32, and a transmission belt 346 wrapped around the adjusting pulleys 344 and enclosing the tops and bottoms of the support plate 322. The transmission belt 346 is made of EMI shielding material. The transmission belt 346 located between and above the adjusting pulleys 344 defines a through hole 3464. The motor 342 includes a drive roller 3422. One of the adjusting pulleys 344 above the motor 342 includes a roller 3442 opposite to the drive roller 3422. A belt 3444 surrounds the drive roller 3422 and the roller 3422. The motor 342 drives the adjusting pulleys 344 to rotate through the drive roller 3422, the belt 3444, and the roller 3422. The transmission belt 346 is moved through the adjusting pulleys 344.

The switch 36 includes two pairs of infrared sensors 362, a controller 364 for controlling the motor 342, and two cables 366, each cable 366 connecting the controller 364 and one of a corresponding pair of infrared sensors 362. Each pair of infrared sensors 362 are respectively installed at one of the ends of the support plate 322, located at opposite ends of the slide grooves 324.

Figure 3:
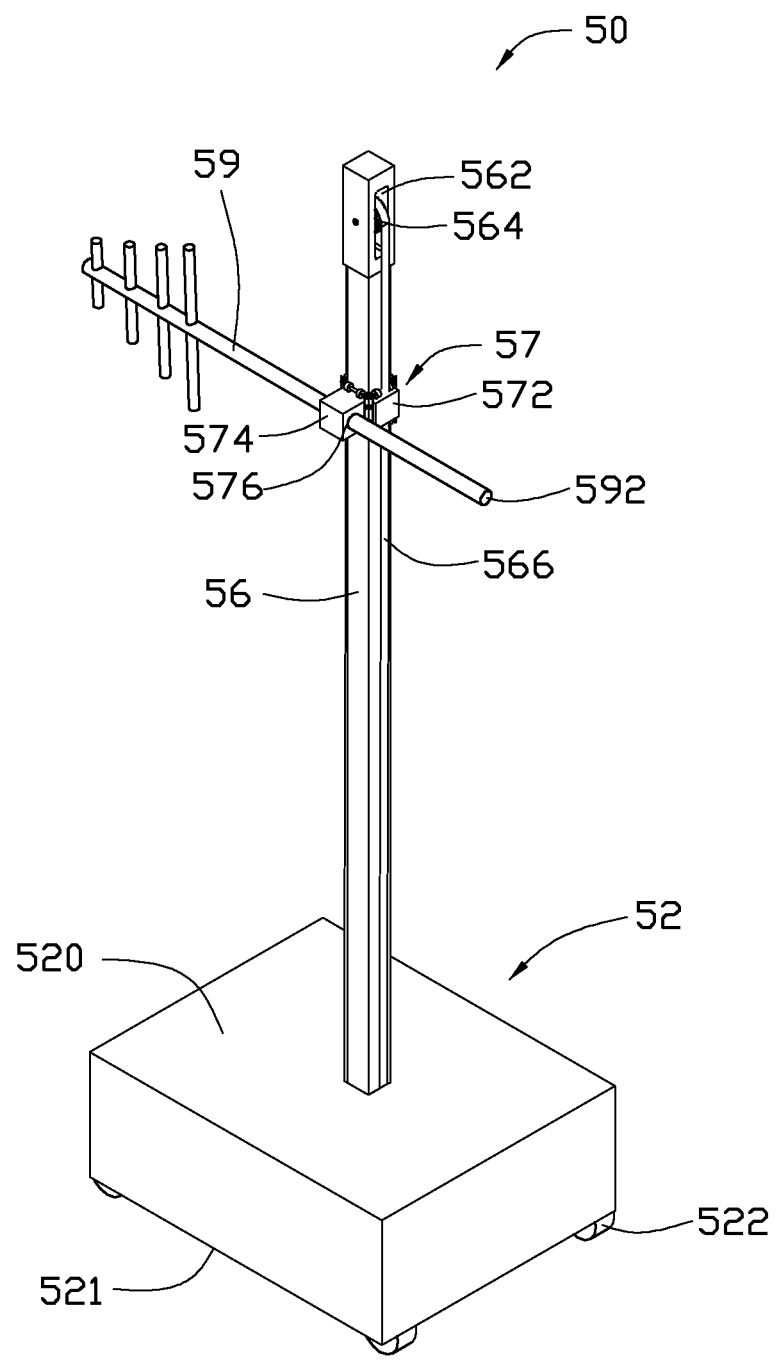
FIG. 3 is an enlarged, isometric view of the antenna holding device of FIG. 1.

FIG. 3, illustrates one embodiment of the antenna holding device 50. The antenna holding device 50 includes a base 52, an adjusting pole 56, an installation bracket 57, and an antenna 59.

The base 52 includes a bottom surface 521 and a top surface 520 opposite to the bottom surface 521. Four conveying pulleys 522 are installed on the bottom surface 521, and are received in the slide grooves 324 of the support bracket 32.

A bottom end of the adjusting pole 56 can be extended through the through hole 3464 of the transmission belt 346, to be installed to the top surface 520 of the base 52. A through hole 562 is longitudinally defined in a top end of the adjusting pole 56, extending through opposite sides of the adjusting pole 56. An adjusting pulley 564 is rotatably mounted in the through hole 562. A transmission belt 566 is wrapped around the adjusting pulley 564 and is pulled to extend longitudinally along the adjusting pole 56 by a motor (not shown) installed in the base 52. A rotation of the adjusting pulley 562 can drive the transmission belt 566 to move along the adjusting pole 56.

The installation bracket 57 includes a plurality of connecting plates 572 connected end to end to slidably fit about the adjusting pole 56. A positioning block 574 is installed on one of the connecting plates 572. The transmission belt 566 is fixed to another connecting plate 572 neighboring connecting plate 572 is configured with the positioning block 574. The positioning block 574 defines a through hole 576 along the horizontal direction.

The antenna 59 includes a support pole 592 extending from an end of the antenna 59. The support pole 592 extends through the through hole 576 of the positioning block 574.

Figure 4:
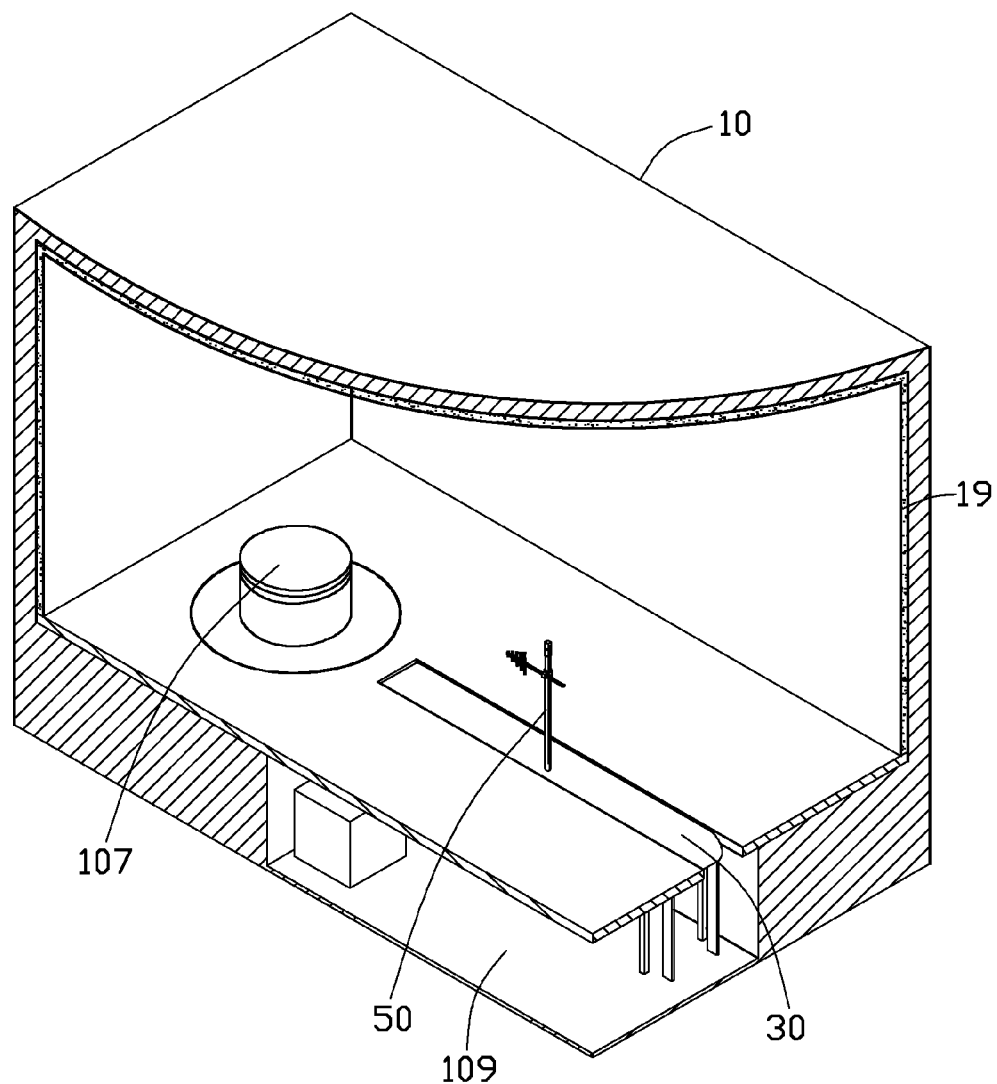
FIG. 4 is an assembled, isometric view of the electromagnetic anechoic chamber of FIG. 1.

Referring to FIG. 4, in assembly, the base 52 is supported on the support plate 322 of the support bracket 32, to allow the conveying pulleys 522 to be received in the corresponding slide grooves 324. The bottom end of the adjusting pole 56 extends through the through hole 3464 of the transmission belt 346, to be installed to the base 52. A combination of the adjusting apparatus 30 and the antenna holding device 50 is installed to the anechoic chamber 10. The adjusting apparatus 30 is received in the receiving space 109. The transmission belt 346 fills the slot 108 of the shielding plate 106, for shielding the electromagnetic radiation signals generated by the motor 342. Thereby, the antenna 59 aligns with the test bench 107.

The controller 364 can control the rotation direction of the drive roller 3422 of the motor 342, according to positions of the base 52 sensed by the infrared sensors 362, so that the antenna holding device 50 moves along the slide grooves 324 of the support bracket 32 relative to the ITE 90. The antenna holding device 50 can be moved between the infrared sensors 362.

Figure 5:
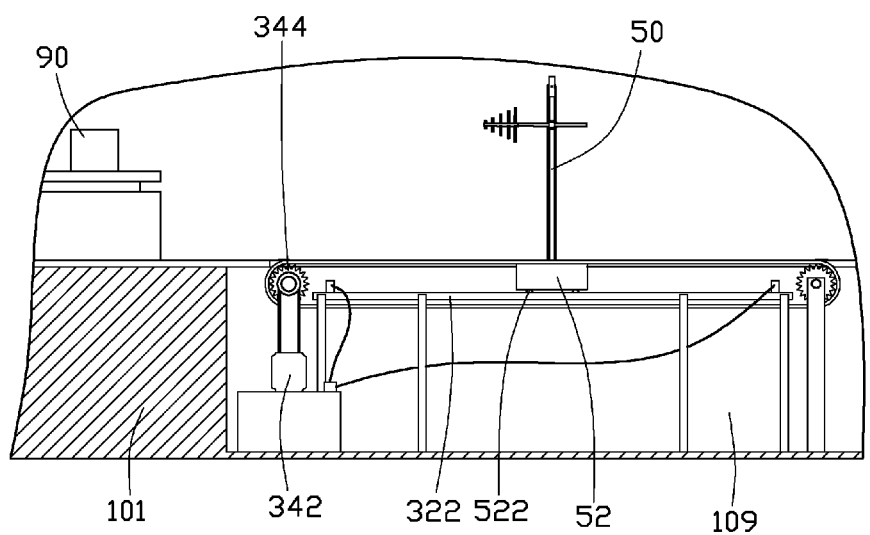
FIG. 5 is a side planer view of FIG. 4, showing the electromagnetic anechoic chamber in use.

Referring to FIG. 5, in use, the ITE 90 is supported on the test bench 107, the motor 342 drives the pulleys 344 to rotate, the transmission belt 346 is moved through the pulleys 344 to move the antenna holding device 50, thereby a distance between the antenna 59 and the ITE 90 can be adjusted to be equal to the specification distance. The adjusting pulley 564 is rotatably driven by the motor in the base 52, and drives the installation bracket 57 to slide along the adjusting pole 56 through the transmission belt 566, until the antenna 70 is adjusted to a predetermined height. Thus, the antenna 59 can be used in electromagnetic measurement.

When testing another ITE 90, the motor 342 rotates the drive roller 3422. The drive roller 3422 moves the transmission belt 346. The transmission belt 346 moves the antenna holding device 50 along the slide grooves 324, until the distance between the antenna 59 and the another ITE 90 is equal to the specification distance for measuring the another ITE 90.

Even though numerous characteristics and advantages of the embodiments have been set forth in the foregoing description, together with details of the structure and function of the embodiments, the present disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. An electromagnetic anechoic chamber, comprising:
   an anechoic chamber comprising a bottom wall defining a receiving space, and a shielding plate supported on the bottom wall;
   an adjusting apparatus comprising a support bracket received in the receiving space of the bottom wall, two adjusting pulleys respectively installed to two opposite ends of the support bracket, a transmission belt wrapping around the adjusting pulleys and defining a through hole, and a motor to drive the adjusting pulleys to rotate; and
   an antenna holding device comprising a base slidably supported on the support bracket, an adjusting pole extending up from the base and extending through the through hole of the transmission belt, and an antenna installed to the adjusting pole and above the transmission belt and the shielding plate.

2. The electromagnetic anechoic chamber of claim 1, wherein the support bracket comprises a rectangular support plate and a plurality of support posts extending down from the supporting plate, the adjusting pulleys are rotatably installed at opposite ends of the support plate, the transmission belt wrapping around the adjusting pulleys and the support plate.

3. The electromagnetic anechoic chamber of claim 2, wherein a top surface of the support plate of the support bracket defines two slide grooves extending along a lengthwise direction of the supporting plate, four conveying pulleys are installed to a bottom surface of the base and respectively received in the slide grooves.

4. The electromagnetic anechoic chamber of claim 3, wherein the adjusting apparatus further comprises a controller for controlling the motor, and two pairs of infrared sensors respectively installed at opposite ends of the supporting plate, the controller controls the rotation direction of the motor according to a position of the base sensed by the infrared sensors, the antenna holding device is moved along the slide grooves between the infrared sensors.

5. The electromagnetic anechoic chamber of claim 1, wherein the shielding plate is made of electromagnetic interference shielding material.

6. The electromagnetic anechoic chamber of claim 1, wherein the transmission belt is made of electromagnetic interference shielding material, the through hole of the transmission belt is located between and above the adjusting pulleys.

7. The electromagnetic anechoic chamber of claim 6, wherein the shielding plate defines an slot communicating with the receiving space, the transmission belt located between and above the adjusting pulleys and shielding the slot.

8. The electromagnetic anechoic chamber of claim 1, wherein a test bench is supported on the shielding plate for supporting an information technology equipment (ITE), the antenna holding device further comprises an installation bracket slidably fitted about the adjusting pole along a lengthwise direction of the adjusting pole, the antenna is installed to the installation bracket and aligns with the ITE.

9. The electromagnetic anechoic chamber of claim 1, wherein the anechoic chamber further comprises a top wall parallel to the bottom wall, and a sidewall connected between the bottom wall and the top wall, inner surfaces of the sidewall and the top wall are coated with electromagnetic wave absorptive material.

* * * * *